United States Patent [19]

Rumbut, Jr.

[11] Patent Number: 5,740,018

[45] Date of Patent: Apr. 14, 1998

[54] ENVIRONMENTALLY CONTROLLED CIRCUIT PACK AND CABINET

[75] Inventor: John T. Rumbut, Jr., Assonet, Mass.

[73] Assignee: The United States of America as represented by the Secretary of the Navy, Washington, D.C.

[21] Appl. No.: 613,783

[22] Filed: Feb. 29, 1996

[51] Int. Cl.$^6$ ............................................... H05K 7/20
[52] U.S. Cl. ...................... 361/720; 62/259.2; 165/46; 257/716; 361/699; 361/796
[58] Field of Search ...................... 165/46, 104.27, 165/104.29, 104.33, 104.34, 80.4, 185; 62/412, 418, 419, 426, 259.2; 257/706, 707, 712–716, 721, 723, 724; 174/15.1, 16.1, 252; 361/690–695, 699–701, 704, 724, 715–720, 725, 784, 727–729, 796, 800

[56] References Cited

U.S. PATENT DOCUMENTS

| | | |
|---|---|---|
| 3,406,244 | 10/1968 | Oktay. |
| 3,648,113 | 3/1972 | Rathjen. |
| 4,493,010 | 1/1985 | Morrison ................................ 361/698 |
| 4,514,746 | 4/1985 | Lundqvist ............................... 361/698 |
| 5,210,680 | 5/1993 | Scheibler ................................ 361/796 |
| 5,245,508 | 9/1993 | Mizzi ...................................... 361/699 |

FOREIGN PATENT DOCUMENTS

| | | | |
|---|---|---|---|
| 0220954 | 11/1985 | Japan ...................................... | 361/699 |
| 3030399 | 2/1991 | Japan ...................................... | 361/699 |

*Primary Examiner*—Gerald P. Tolin
*Attorney, Agent, or Firm*—Michael J. McGowan; James M. Kasischke; Prithvi C. Lall

[57] ABSTRACT

An apparatus for controlling the operating conditions of individual electronic circuit boards and a circuit board cabinet for holding one or more environmentally controlled circuit packs is provided. The enclosure provides both electronic ports and cooling ports. The cooling ports may be used to circulate liquid or gaseous coolant over the surface of the circuit board thereby dissipating built up heat. The electronic ports allow the board to be externally connected to other electronic components. Additionally, the enclosure provides an electrostatic buffer that protects the enclosed circuit board from electrostatic shock during operation or while the board is being externally handled and stored. Finally, the enclosure provides a barrier against foreign particles such as dust and moisture. The cabinet allows a plurality of circuit boards to be mounted in one cabinet and cooled by a single cooling source. It also provides coolant draining capabilities and a coolant distribution system.

6 Claims, 4 Drawing Sheets

ENVIRONMENTALLY CONTROLLED CIRCUIT PACK AND CABINET

STATEMENT OF GOVERNMENT INTEREST

The invention described herein may be manufactured and used by or for the Government of the United States of America for Governmental purposes without the payment of any royalties thereon or therefor.

BACKGROUND OF THE INVENTION (1) Field of the Invention

The present invention relates generally to the field of computational equipment. In particular, it is a device for limiting an electronic circuit board's exposure to temperature extremes, moisture, foreign matter, and electrostatic fields.

(2) Description of the Prior Art

With the evolution of high powered sophisticated computational equipment, the control of the equipments' operating environment has become a relevant problem in the art. The majority of the prior art addressing these problems has been focused on component level heat dissipation. Commonly in these cases, a heat conducting device or heat sink is directly attached to the heat generating component. The heat sink speeds the transfer of heat from the particular component. In cases of severe heat, the heat sink may be directly cooled by an external cooling device.

However, as high power components have become more widely used, and the density of circuit components on integrated circuit boards has increased, the temperature of the air directly around the circuit board has also increased. This effect is not due from any single component, but rather is a net effect of all the components on the circuit board. In several electronic devices, multiple circuit boards are mounted within a common chassis in very close proximity to each other. This proximity reduces air flow through the chassis and, when added to the difficulty in using heat sinks on integrated boards, results in an aggravated heat problem.

In order to address this increased problem in heat dissipation, efforts have been made in the prior art to cool either the entire chassis or the entire room that the circuit boards reside in. Using both air and liquid cooled systems, the prior art has been able to lower the ambient temperature surrounding the boards to an operable level. Additionally, controlling the entire chassis or room provides environmental control of other harmful influences that might degrade the operation of the circuit boards; specifically, moisture levels, dust and other foreign matter, and other electrostatic fields.

However, the raw size of the area that must be controlled to achieve these benefits using the prior art methodologies has been a major drawback. In particular, the costs, both in terms of equipment and of power consumption, involved with establishing and maintaining the controlled environment are often substantial. Circuit boards installed within such an environment are often difficult to access, requiring a shutdown and re-establishment of the controlled environment for the affected card and any others which share the same control system. Finally, the large size of the controlling structures make their use in mobile or limited space applications difficult.

SUMMARY OF THE INVENTION

Accordingly, it is an object of the invention to provide an apparatus for controlling the operating environment of circuit boards while minimizing the space, energy, and coolant system requirements.

It is a further object to provide a controlled environment for the circuit board which is independent of the external environment of the board.

A still further object is to facilitate repair and replacement of defective boards while maintaining the operating environment of other circuit boards in the same or nearby locations.

Yet another object is to facilitate storage and handling of the circuit boards while they are not in active use.

The invention is a cabinet with enclosures for holding one or more circuit packs, each pack having a plurality of both electronic ports and cooling ports. The cooling ports are used to circulate liquid or gaseous coolant over a surface of the circuit board thereby removing any heat build-up. The electronic ports allow the circuit boards to be externally connected to the electronic components. The enclosure also provides an electrostatic buffer that protects the enclosed circuit boards from electrostatic shock during handling or storage. Additionally, the enclosure provides a barrier to foreign matter, such as dust or moisture.

BRIEF DESCRIPTION OF THE DRAWINGS

The foregoing and other objects of the present invention will be more fully understood from the following detailed description and reference to the appended drawings wherein.

DESCRIPTION OF THE PREFERRED EMBODIMENTS

Figure 1:
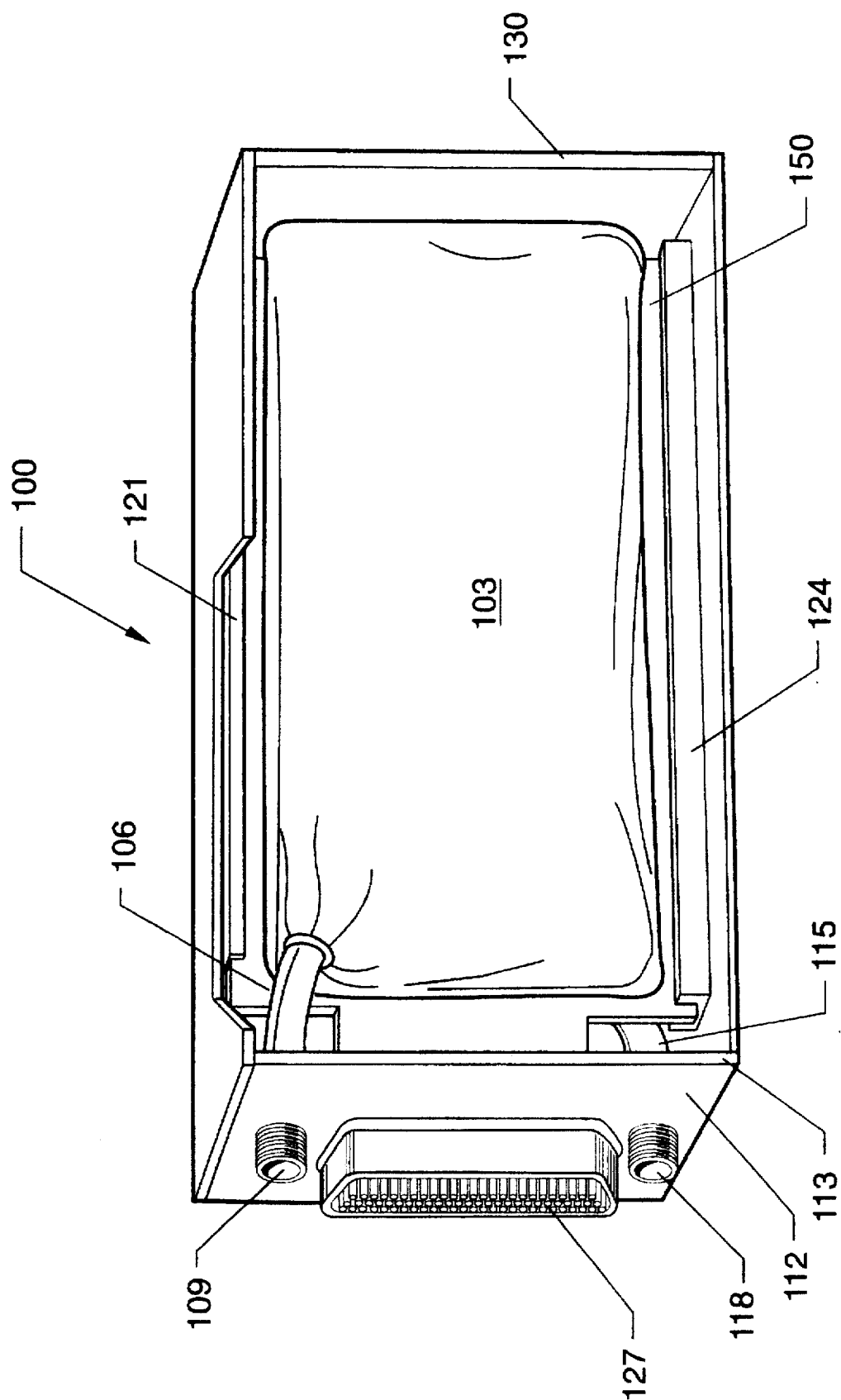
FIG. 1 is a perspective view of the environmentally controlled circuit pack with a cutaway view revealing the interior of the pack.

Referring now to the drawings, and in particular to FIG. 1, one embodiment is shown of the environmentally controlled circuit board module or circuit pack. Circuit pack enclosure 100 is a sealable enclosure having a removable rear panel 112 and contains an internally mounted hollow coolant envelope 103. The rear panel 112 is sealed with a silicone-based synthetic gasket 113 material which remains supple over a wide range of temperatures. Coolant input connector 106 connects the interior of coolant envelope 103 to external coolant input port 109 which extends through enclosure rear panel 112. The interior of coolant envelope 103 is also connected by coolant output connector 115 to external coolant output port 118. External coolant output port 118 also extends through enclosure rear panel 112. Electric circuit board 150 is disposed within circuit pack enclosure 100 and mounted on upper rails 121 and lower rails 124 so as to be held immovably in place between section of coolant envelope 103. These rails 121 and 124 extend perpendicular to the surface of the rear panel 112 thereby allowing electronic circuit boards to slide in or out of the enclosure 100. External electrical leads of circuit board 150 are exposed within circuit pack enclosure 100 and extend through electrical connector 127 in enclosure rear panel 112.

During operation, coolant flows through coolant transmission network comprising the pump or external cooling unit 250 (shown in FIG. 2) and associated tubing and valves. The coolant flows from an external coolant supply into external coolant input port 109. After passing through enclosure rear panel 112, the coolant passes through coolant input connector 106 and into coolant envelope 103. The coolant circulates internally through coolant envelope 103 and reaches coolant output connector 115. After passing through enclosure rear panel 112, the coolant proceeds through external coolant output port 118 and back to the external coolant supply.

In the preferred embodiment, external coolant input port 109 and external coolant output port 118 are threaded for ease of connection of external coolant supply lines; however both ports could be constructed with a variety of other connecting means which would provide an air and liquid tight seal. Coolant envelope 103 must be constructed of a material that is heat resistant as well as coolant impermeable; however, these materials are well known in the art, and many may be used interchangeably. Electrical connector 127 is simply an environmentally sealed circuit which provides external electrical connectivity to circuit board 150 through enclosure rear panel 112. This actual type of connector used will vary with the type of circuit board installed within the pack. In some cases, there may be more than one electrical connector 127. Additionally, an electrical connector may also be required in front panel 130 of circuit pack enclosure 100 in order to provide direct backplane connectivity to a chassis backplane for circuit board 150. The exact arrangement and composition of these details may be varied by those skilled in the art within the principle and scope of the present invention.

Figure 2:
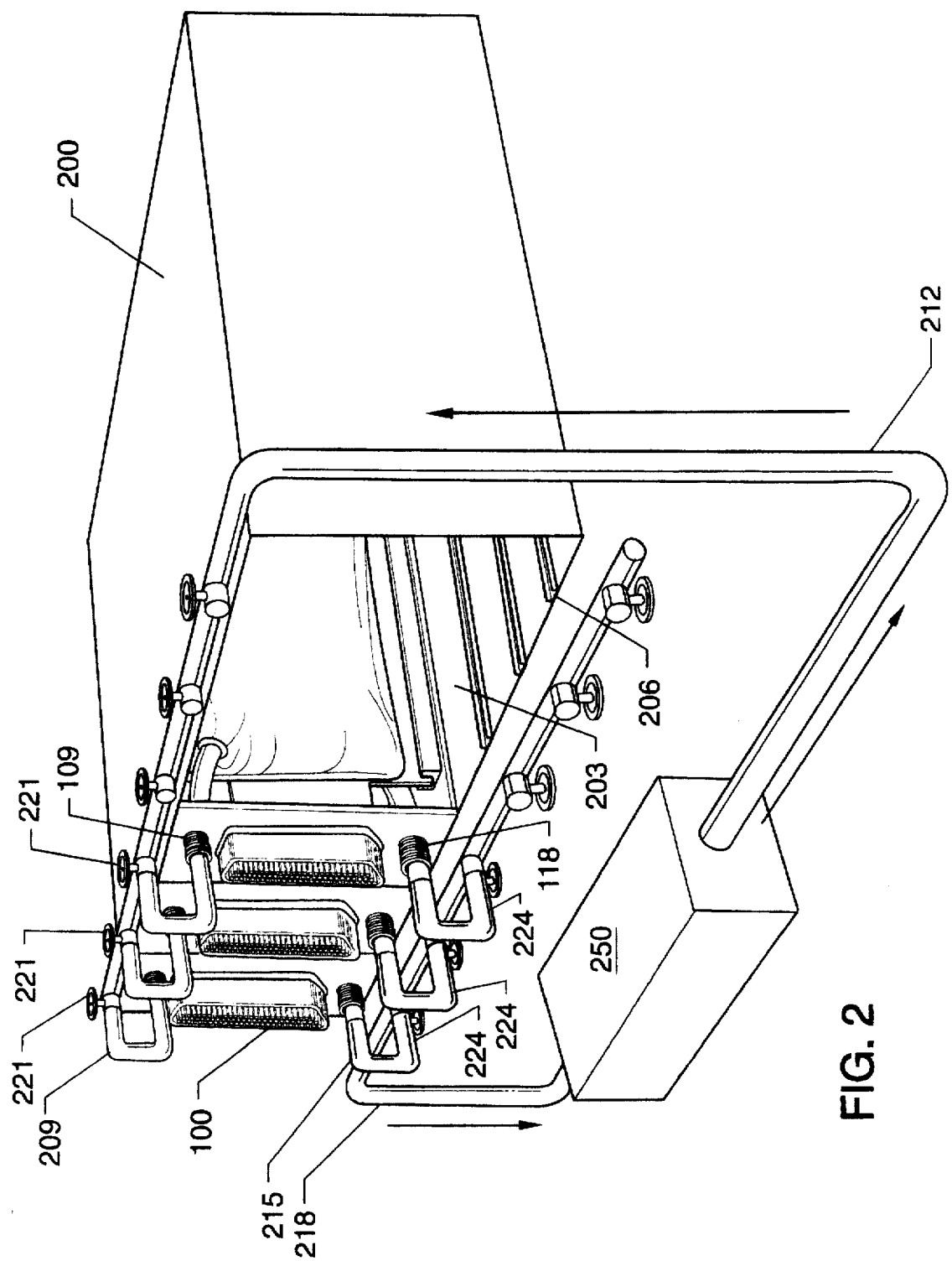
FIG. 2 is a perspective view of a circuit pack cabinet showing the placement of circuit packs therein.

Referring now to FIG. 2, one embodiment of a complete circuit board cabinet is provided. Circuit board cabinet 200 is an exterior housing having a plurality of slots 203, each of which consists of an upper guiderail (not depicted) and lower guiderail 206. Circuit pack enclosure 100 is held in place within circuit board cabinet 200 by upper and lower guiderails 206. Coolant input hose 209 is connected between external coolant input port 109 and coolant input pipe 212. Coolant drain hose 215 is connected between external coolant output port 118 and coolant outflow pipe 218. Outflow shutoff valves 224 are located at the connection point for each slot 203 along coolant outflow pipe 218 and govern coolant flow from each slot. Outflow shutoff valve 224 maintains system pressurization when slot 203 does not contain a circuit pack enclosure 100.

During system operation, coolant is pumped by external cooling unit 250 through coolant input pipe 212 to each inflow shutoff valve 221. If inflow shutoff valve 221 is open, the coolant flows through coolant input hose 209 and into external coolant input port 109. After circulating through circuit pack enclosure 100, the coolant continues through external coolant output port 118 and coolant drain hose 215 to outflow shutoff valve 224. If outflow shutoff valve 224 is open, the coolant continues into coolant outflow pipe 218 and is returned to external cooling unit 250.

It is important that the integrity of the entire coolant distribution system be maintained for several reasons. First, the introduction of a non-coolant material into the coolant system could reduce the operating effectiveness of the entire system. Additionally, the operating pressure of the system must be maintained in order to produce coolant flow through the system. Outflow shutoff valves 224 control the coolant flow into coolant outflow pipe 218. Inflow shutoff valves 221 control the coolant flow from coolant input pipe 212. When no circuit board enclosures 100 are in one or more slots 203, these valves allow the halting of flows to the empty slots thus maintaining system integrity.

Figure 3:
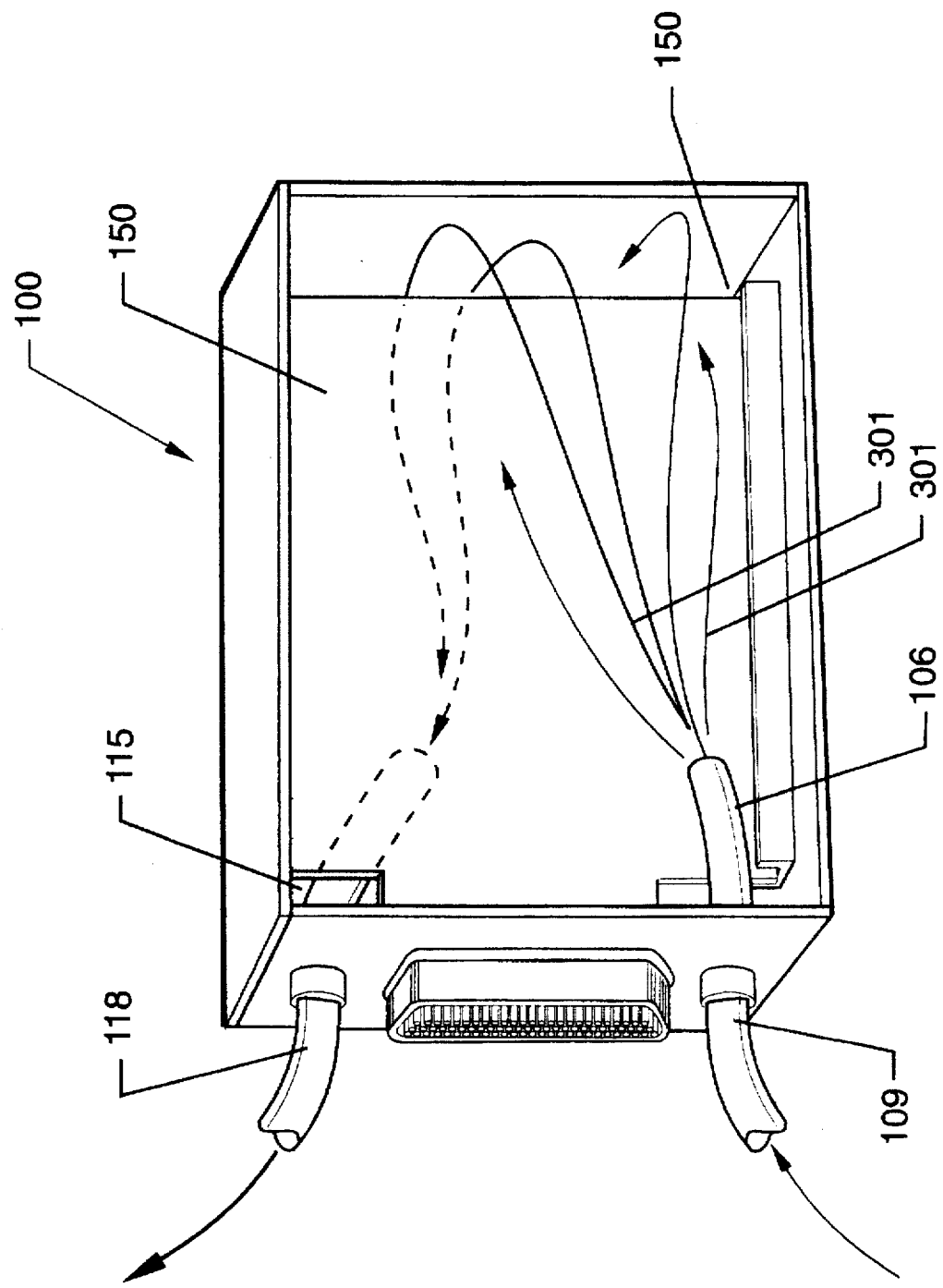
FIG. 3 is a perspective view of the circuit pack configured for a gaseous coolant.
Figure 4:
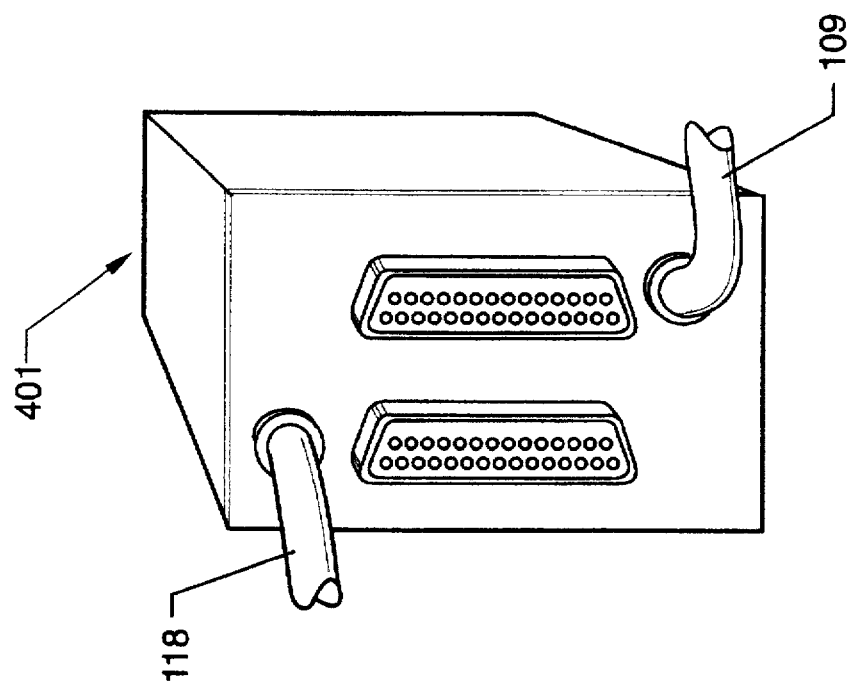
FIG. 4 is an end perspective view of a multiple circuit board pack.

A coolant can be selected from multiple coolants for use with the circuit pack 100 including both gaseous and liquid coolants. As depicted in FIG. 3, the coolant envelope can be removed from the circuit pack allowing a gaseous coolant represented by arrows 301 flow around the circuit board. The coolant input connector 106 is disconnected from the coolant envelope permitting air flow, for example, around the circuit board 150. The coolant output connector 115 provides an air pickup on the opposite side of the circuit board 150. In this embodiment, several configurations are possible. First, a low pressure and low volume of cooled air can be directed to the circuit pack and simply vented at the external coolant output port 118. It is also possible to provide a short duration cryogenic environment by providing an external cooling unit 250 having a source of cryogenic liquid such as liquid nitrogen, which evaporates in the circuit pack and is then also vented. By use of this configuration a small lightweight, affect short duration effect, cryogenic pack can be operated. Alternately, the external cooling unit 250 can embody a compressor unit using any suitable refrigerant as a coolant gas, the circuit pack 100 again being used as the evaporator section by use of a conventional regulator in the external coolant input port 109. Referring now to FIG. 4, a circuit pack 401 containing two circuit boards is shown. As in the previous embodiments, multiple types of coolants can be used, both liquid and gaseous. As noted in the previous embodiments, where a liquid is used within the circuit pack, a coolant envelope provides the containment and path for the coolant, where a gaseous coolant is used, the envelope is removed and the circuit boards and partitions provide the flow path.

Figure 5:
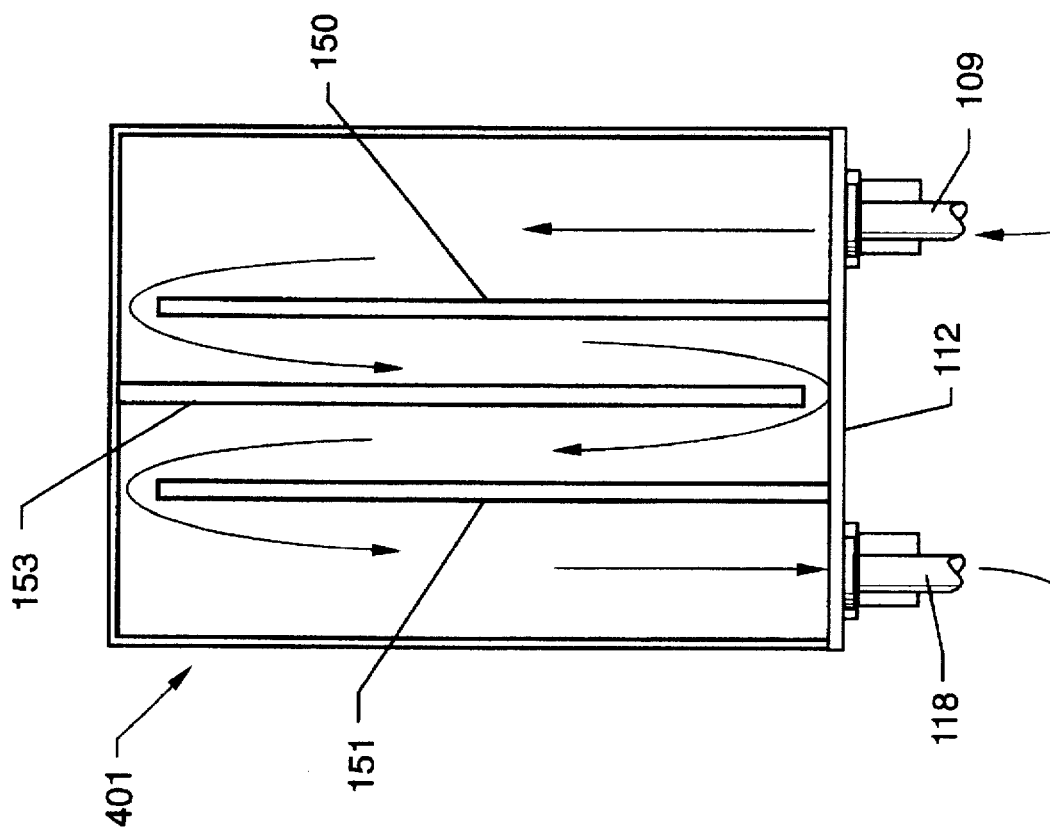
FIG. 5 is a top view diagram showing the gaseous coolant path with a circuit pack containing two circuit boards.

FIG. 5 provides a cut-away top view of circuit pack 401 showing the gaseous coolant flow into external coolant input port 109, which then flows around circuit board 150, but upon reaching the rear panel 112, is vented around circuit board 151. Partition 153 insures that coolant flow moves along the inner surfaces of both boards prior to exiting at external coolant output port 118.

The features and advantages of the present invention are numerous. The circuit pack allows cooling of selected circuit boards, either individually or in groups, without the requirement to cool large environments enclosing entire computers. It also allows field operation of a computer where it is not possible to control the external environment. Further, it allows use of a variety of different coolants, including both gaseous and liquid, without changing hardware. The only requirement is to insert or remove the cooling envelope. Additionally, the circuit pack makes possible the side-by-side use of circuit boards with greatly varying temperature requirements. One circuit pack can operate cryogenically while an adjacent pack operates on only refrigerated air, for example. As a secondary benefit, the circuit pack provides a general protective enclosure sealing out dust, moisture and other contaminants.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. An apparatus for cooling an electronic circuit board comprising:

a sealable enclosure having a removable first panel for mounting said circuit board therein;

means for mounting and stabilizing said electronic circuit board disposed within said enclosure;

an electrical connector mounted on the first panel of said sealable enclosure allowing electrical leads to be connected both internal to and external to said enclosure;

coolant envelope attached within said sealable enclosure thereby creating an enclosed space along the plane of said mounting and stabilizing means;

a coolant input port attached to said envelope and extending through the first panel of said enclosure; and an coolant output port attached to said envelope and extending through the first panel of said enclosure.

2. An apparatus as in claim 1 wherein said mounting and stabilizing means are upper and lower rails rigidly attached to the interior of said enclosure and oriented with said rails extending perpendicular to the first panel.

3. An apparatus as in claim 1 wherein said sealable enclosure has an elastomeric gasket located between the removable first panel and said enclosure, thereby preventing air, dirt particles, and moisture from entering said enclosure.

4. An apparatus as in claim 1 wherein said sealable enclosure is fabricated with an electrostatic and electromagnetic shielding material.

5. A cabinet for holding multiple circuit card enclosures comprising:

an external housing having a plurality of circuit card slots and top, bottom, and side panels;

a plurality of mounting means disposed within said external housing, said plurality of mounting means defining the location of said slots;

a plurality of cooled circuit board modules attached to said mounting means within the slots, each said circuit board module comprising:

an external enclosure having a sealable rear panel;

means for mounting and stabilizing said circuit board modules disposed within said enclosure;

an electrical connector mounted on said rear panel of said enclosure such that electrical leads are presented both internal to and external to said enclosure;

a hollow coolant envelope attached to said top, bottom, and side panels thereby creating an enclosed space along the plane of said mounting means;

an input coolant port attached to said envelope and extending through said rear panel of said enclosure;

an output coolant port attached to said envelope and extending through said rear panel of said enclosure; and a coolant transmission network attached to said external housing and said circuit board modules.

6. A cabinet as in claim 5 wherein said mounting and stabilizing means are upper and lower rails rigidly attached to the interior of said enclosures such that said rails extend perpendicular to the rear panel.

* * * * *